US010916671B2

(12) United States Patent
Jang et al.

(10) Patent No.: US 10,916,671 B2
(45) Date of Patent: Feb. 9, 2021

(54) SOLAR CELL MODULE

(71) Applicant: LG ELECTRONICS INC., Seoul (KR)

(72) Inventors: Daehee Jang, Seoul (KR); Minpyo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 345 days.

(21) Appl. No.: 14/931,507

(22) Filed: Nov. 3, 2015

(65) Prior Publication Data

US 2016/0126386 A1 May 5, 2016

(30) Foreign Application Priority Data

Nov. 4, 2014 (KR) .................. 10-2014-0152366

(51) Int. Cl.
*H01L 31/0216* (2014.01)
*H01L 31/048* (2014.01)
*H01L 31/05* (2014.01)

(52) U.S. Cl.
CPC .... *H01L 31/0504* (2013.01); *H01L 31/02167* (2013.01); *H01L 31/048* (2013.01); *H01L 31/0512* (2013.01); *H01L 31/0516* (2013.01); *Y02E 10/50* (2013.01)

(58) Field of Classification Search
CPC ....... H01L 2924/00; H01L 2224/48227; H01L 31/022441; H01L 31/0516; H01L 31/022425; H01L 31/0682; H01L 31/0504; H01L 31/18; H01L 31/022433; H01L 31/0508; H01L 31/02008; H01L 31/02245; H01L 31/0201; H01L 31/02021; H01L 31/02167; H01L 31/022458; Y02E 10/50; Y02P 70/521
See application file for complete search history.

(56) References Cited

U.S. PATENT DOCUMENTS

| | | | | |
|---|---|---|---|---|
| 2007/0295381 A1* | 12/2007 | Fujii | ............... | H01L 31/02243 136/244 |
| 2009/0126788 A1 | 5/2009 | Hishida et al. | | |
| 2012/0204938 A1* | 8/2012 | Hacke | ............... | H01L 31/02244 136/246 |
| 2012/0279546 A1* | 11/2012 | Kutzer | ............. | H01L 31/02244 136/244 |

(Continued)

FOREIGN PATENT DOCUMENTS

| | | |
|---|---|---|
| CN | 103337529 A | 10/2013 |
| KR | 10-2012-0131315 A | 12/2012 |
| WO | WO 2012/173487 A1 | 12/2012 |

*Primary Examiner* — Mayla Gonzalez Ramos
(74) *Attorney, Agent, or Firm* — Birch, Stewart, Kolasch & Birch, LLP

(57) ABSTRACT

A solar cell module having an improved wiring structure is disclosed. The solar cell module includes a plurality of solar cells each including first electrodes and second electrodes which are alternately arranged in parallel with each other, a plurality of wiring members configured to electrically connect the plurality of solar cells, and which are positioned adjacent to each other among the plurality of solar cells, in a direction crossing the first electrodes and the second electrodes, and a plurality of bonding layers configured to fix the plurality of wiring members to the plurality of solar cells.

18 Claims, 14 Drawing Sheets

(56) References Cited

U.S. PATENT DOCUMENTS

| | | | |
|---|---|---|---|
| 2013/0139871 A1* | 6/2013 | Hirata | H01L 31/0504 136/251 |
| 2013/0312827 A1* | 11/2013 | Adachi | H01L 31/02242 136/256 |
| 2014/0216544 A1* | 8/2014 | Nakahara | C09J 7/10 136/256 |
| 2015/0357497 A1* | 12/2015 | Mu | C09J 9/02 136/256 |

* cited by examiner

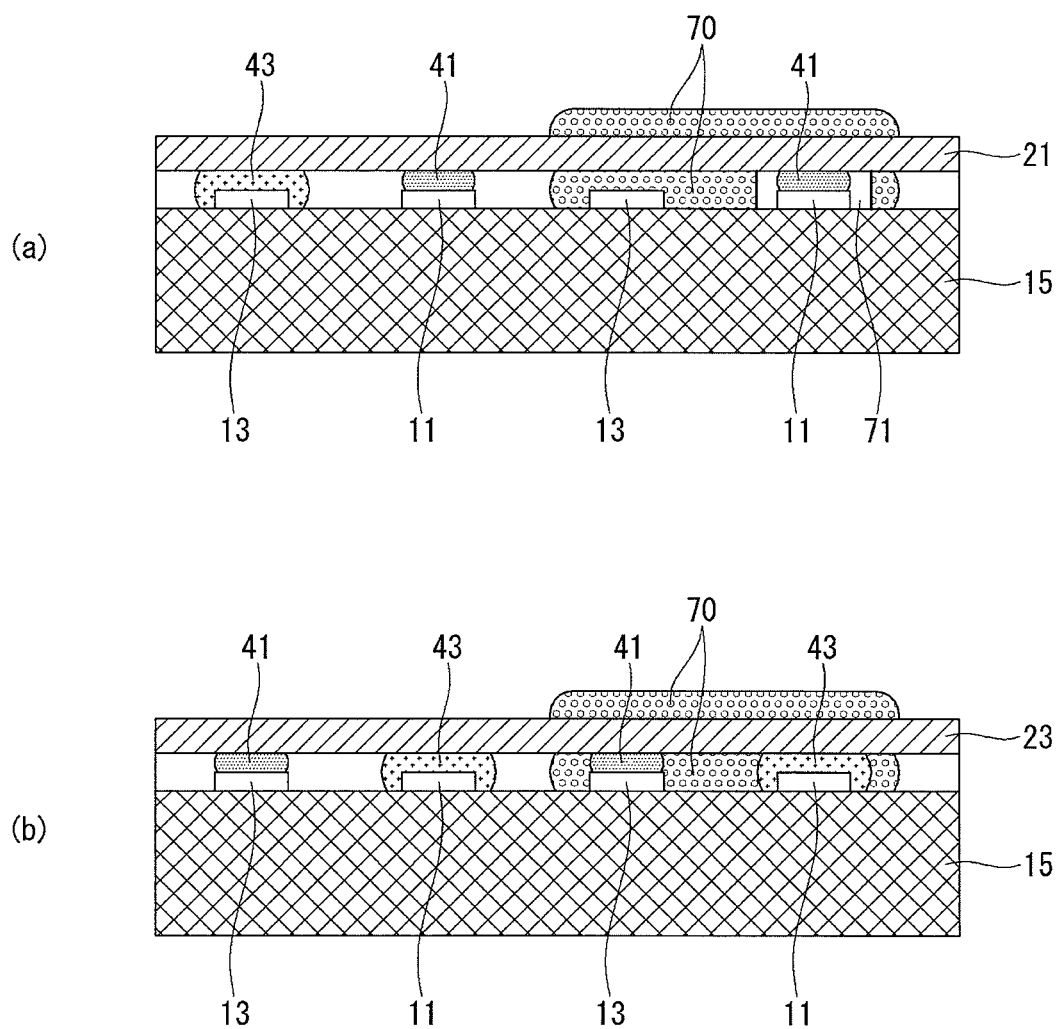

SOLAR CELL MODULE

CROSS-REFERENCE TO RELATED APPLICATION

This application claims priority to and the benefit of Korean Patent Application No. 10-2014-0152366 filed in the Korean Intellectual Property Office on Nov. 4, 2014, the entire contents of which are incorporated herein by reference.

BACKGROUND OF THE INVENTION

Field of the Invention

The present disclosure relates to a solar cell module having an improved wiring structure between wiring members and solar cells.

Description of the Related Art

A solar cell includes a semiconductor substrate forming a p-n junction, an emitter region, a back surface field region, and electrodes connected to the semiconductor substrate using the emitter region or the back surface field region as an interface. The solar cells having the above-described configuration are electrically connected to each other through an interconnector having the size of about 1.5 mm to form a solar cell module. About three interconnectors are generally used to electrically connect the two adjacent solar cells.

According to an existing technology, a bus electrode is required to connect the interconnector to the solar cell.

In a back contact solar cell, in which all of electrodes are positioned on a back surface of a solar cell, first and second electrodes collecting carriers of different conductive types are alternately positioned in parallel with each other. Thus, the bus electrode cannot be formed in the back contact solar cell. It is difficult to connect the interconnector to the electrode in such back contact solar cells.

The bus electrode is generally made from the same material (for example, silver (Ag)) as a finger electrode collecting carriers. Use of silver increases the manufacturing cost of the solar cell.

SUMMARY OF THE INVENTION

In one aspect, there is a solar cell module including a plurality of solar cells each including first electrodes and second electrodes which are alternately arranged in parallel with each other, a plurality of wiring members configured to electrically connect the plurality of solar cells, and which are positioned adjacent to each other among the plurality of solar cells, in a direction crossing the first electrodes and the second electrodes, and a plurality of bonding layers configured to fix the plurality of wiring members to the plurality of solar cells, The solar cell module may further include a passivation layer configured to encapsulate the plurality of solar cells, the plurality of wiring members, and the plurality of bonding layers, a water vapor transmission rate of the passivation layer being equal to or greater than a water vapor transmission rate of the plurality of bonding layers.

The passivation layer includes at least one of ethylene vinyl acetate (EVA) copolymer, ethylene-ethyl acrylate (EEA) copolymer, polyvinyl butyral (PVB), polyolefin, silicon, urethane, acrylic, or epoxy.

The bonding layer may be formed of the same material as the passivation layer. The bonding layer is formed of an adhesive resin including at least one of acrylic, epoxy, or UV resin.

A width of the plurality of bonding layers is greater than a width of the plurality of wiring members and is less than a pitch of the plurality of wiring members, and wherein the plurality of bonding layers extends along the plurality of wiring members.

The plurality of bonding layers are positioned in parallel with one another and form a stripe arrangement.

The plurality of bonding layers are entirely formed on each solar cell.

A thickness of the plurality of bonding layers is less than a thickness of the passivation layer.

The plurality of bonding layers include openings exposing the first electrodes at crossings of the plurality of wiring members and the first electrodes.

A thickness of the plurality of bonding layers is greater than a thickness of the second electrodes.

The plurality of bonding layers insulate the second electrodes from the plurality of wiring members at crossings of the plurality of wiring members and the second electrodes.

The first electrodes are soldered to the plurality of wiring members at the openings.

The solar cell module further includes a conductive layer positioned in the openings and configured to connect the plurality of wiring members to the first electrodes, the conductive layer being an adhesive resin including conductive particles.

The conductive particles are particles formed of a conductive metal or are particles formed of a solder including at least one of Pb, Sn, SnIn, SnBi, SnPb, SnCuAg, or SnCu.

The plurality of bonding layers further include second openings exposing the second electrodes at crossings of the plurality of wiring members and the second electrodes. The solar cell module further includes an insulating layer positioned in the second openings and configured to insulate the plurality of wiring members from the second electrodes.

The plurality of wiring members have a rectangular cross section. A width of the plurality of wiring members is 1 mm to 2 mm, and a thickness of the plurality of wiring members is 60 μm to 120 μm. The 10 to 36 of the plurality of wiring members are used to connect adjacent solar cells of the plurality of solar cells.

In one aspect, there is a solar cell module including a plurality of solar cells each including first electrodes and second electrodes which are alternately arranged in parallel with each other; a plurality of wiring members configured to electrically connect the plurality of solar cells, and which are positioned adjacent to each other among the plurality of solar cells, in a direction crossing the first electrodes and the second electrodes; and a plurality of bonding layers configured to fix the plurality of wiring members to the plurality of solar cells, each bonding layer including a plurality of holes, wherein the plurality of holes expose portions of at least one first electrode, portions of at least one second electrode, or both.

According to the present disclosure, the plurality of wiring members are attached to the plurality of solar cell through the plurality of bonding layers. Thus, the plurality of wiring members can be electrically connected to the electrodes of the plurality of solar cell in a state where the plurality of wiring members are easily fixed without a bus electrode.

Furthermore, because the plurality of wiring members are directly connected to the electrodes having a relatively small width, the plurality of wiring members may be easily detached from the electrodes. However, the present disclosure can prevent water vapor from passing through the solar cell module by adjusting the water vapor transmission rates of the plurality of bonding layers and the passivation layer. Thus, the present disclosure can prevent the plurality of wiring members and the electrodes from being oxidized at the crossings of the plurality of wiring members and the electrodes, and also prevent a corrosion resulting from the oxidization. As a result, the present disclosure can prevent the plurality of wiring members and the electrodes from being easily detached from each other.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 14 and 15 show a second example where a longitudinal direction of a bonding layer crosses a longitudinal direction of a wiring member.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. It will be noted that a detailed description of known arts will be omitted if it is determined that the detailed description of the known arts can obscure the embodiments of the invention. Wherever possible, the same reference numbers will be used throughout the drawings to refer to the same or like parts. The same or like parts are not repeatedly described.

In the following description, a numerical range is merely an example. The numerical range given as several variables may be adjusted as long as there is no special limit.

Figure 1:
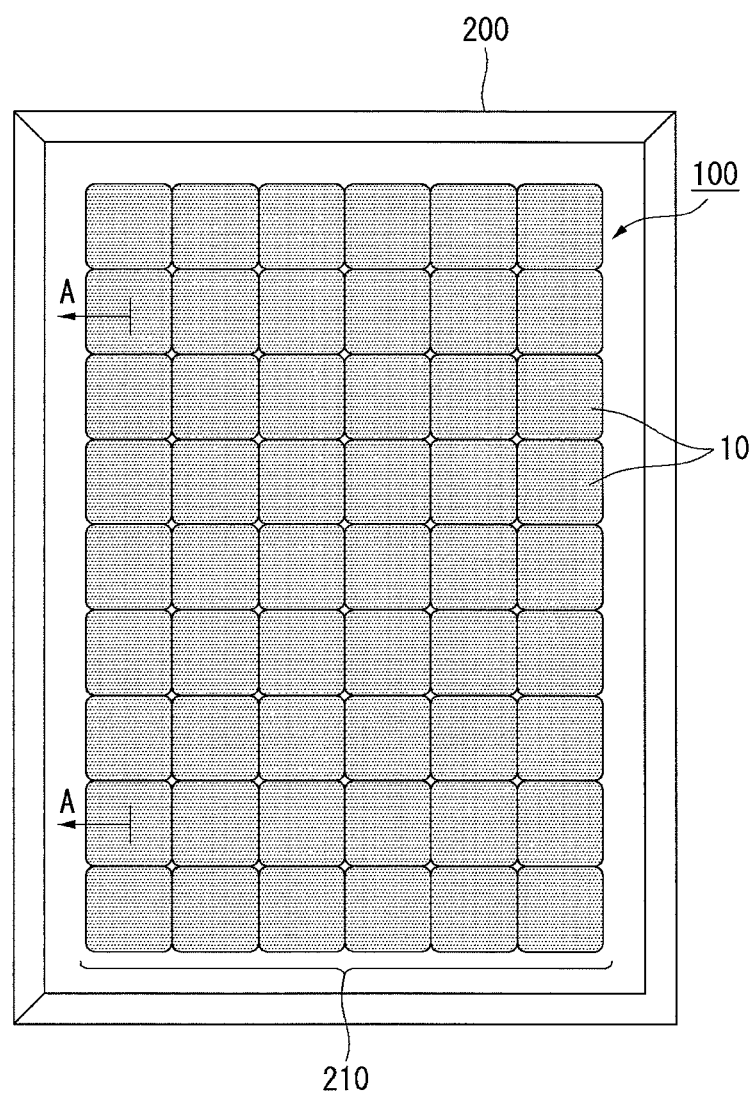
FIG. 1 is a plane view of a solar cell module according to an example embodiment of the invention.
Figure 2:
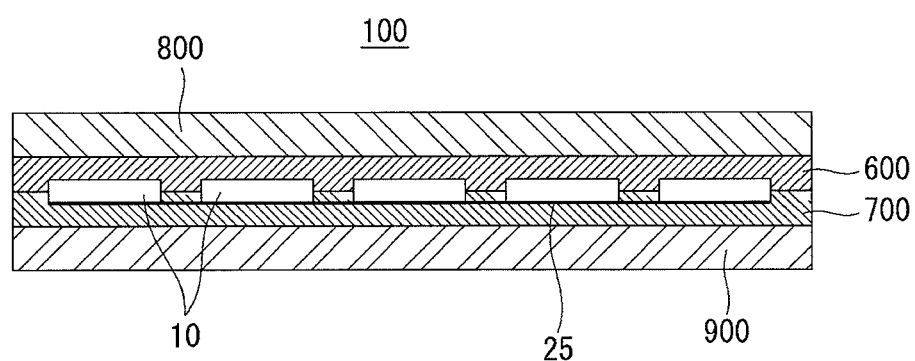
FIG. 2 is a cross-sectional view taken along line A-A of FIG. 1.

FIG. 1 is a plane view of a solar cell module according to an example embodiment of the invention. FIG. 2 is a cross-sectional view taken along line A-A of FIG. 1.

As shown in FIGS. 1 and 2, a solar cell module according to the embodiment of the invention includes a solar cell panel 100 and a frame 200 supporting the solar cell panel 100.

The frame 200 has a shape surrounding the perimeter of the solar cell panel 100 and is coupled with the solar cell panel 100. The frame 200 is made of a light metal material, for example, stainless steel or aluminum.

An assembly 210 constituting the solar cell panel 100 is configured such that a plurality of solar cells 10 are arranged in a matrix form and are electrically connected to one another. The plurality of solar cells 10 are connected to one another through wiring members 25 to form one string. The plurality of strings form a solar cell assembly. FIG. 1 shows that the solar cell assembly is composed of six strings, as an example.

As shown in FIG. 2, the solar cell panel 100 is sandwiched between an upper substrate 800 corresponding to a front surface (for example, an incident surface) and a lower substrate 900 corresponding to a back surface. A transparent upper passivation layer 600 and a transparent lower passivation layer 700 are positioned between the upper substrate 800 and the lower substrate 900 and encapsulate the solar cell assembly. The embodiment of the invention describes that the upper passivation layer 600 and the lower passivation layer 700 are separated from each other. However, the passivation layers 600 and 700 may be formed by thermally processing a liquid material, or alternatively, the passivation layers 600 and 700 may be formed by gelling the passivation layers 600 and 700 of a sheet type. In such instances, the passivation layers 600 and 700 may form a single layer unlike the above discussed embodiment of the invention. The passivation layers 600 and 700 may be formed of permeable resin, such as ethylene vinyl acetate (EVA) copolymer, ethylene-ethyl acrylate (EEA) copolymer, polyvinyl butyral (PVB), polyolefine, silicon, urethane, acrylic, and epoxy.

The upper substrate 800 is a transparent insulating substrate and is preferably formed of a tempered glass. The tempered glass may be a low iron tempered glass containing a small amount of iron. The upper substrate 800 may have an uneven inner surface so as to increase a scattering effect of light.

The lower substrate 900 may include a plurality of functional layers including a moisture/oxygen penetrating prevention layer, a chemical corrosion prevention layer, an insulation layer, etc., so as to prevent moisture and oxygen from penetrating into the solar cell panel and protect the solar cell panel from an external environment. The plurality of functional layers may have a single-layered structure.

The solar cells 10 are electrically connected to each other through the wiring members 25.

Figure 3:
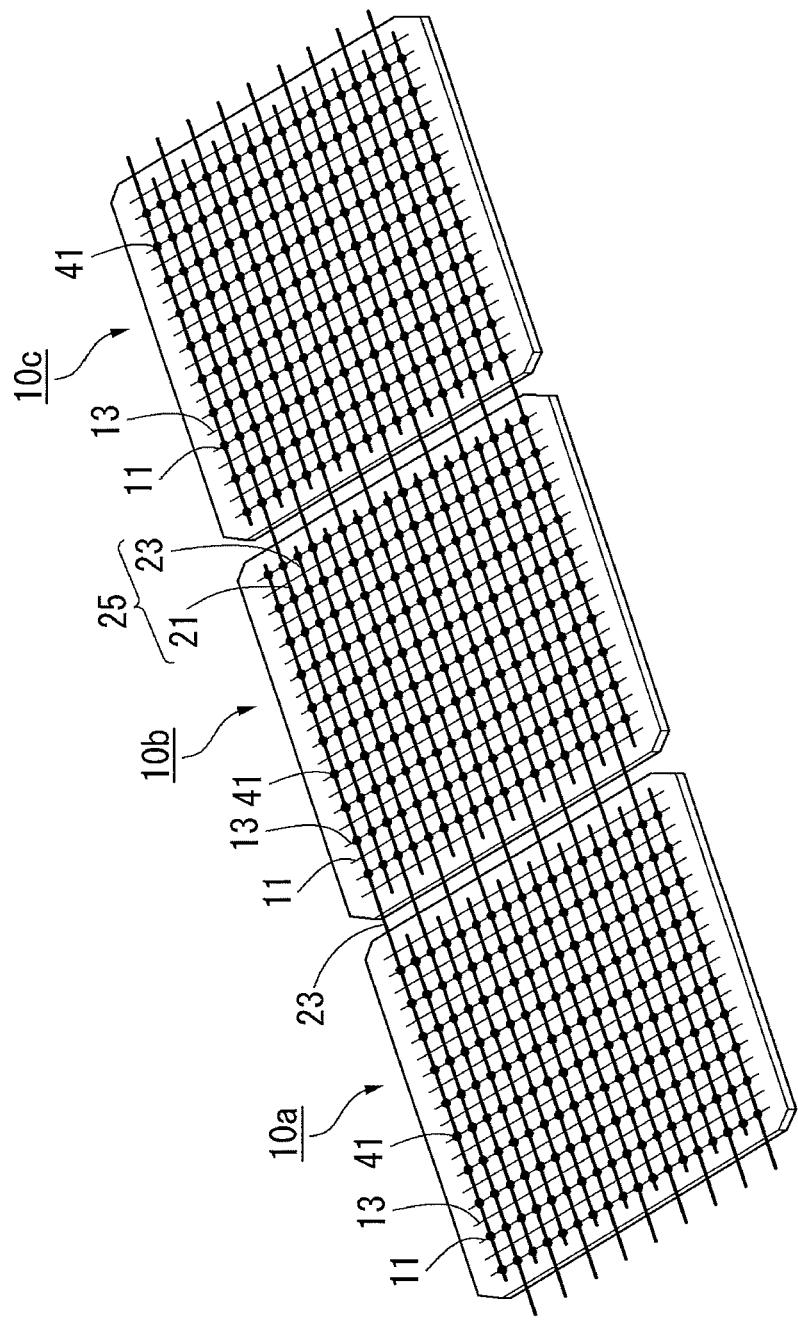
FIG. 3 shows that solar cells are connected to wiring members.
Figure 4:
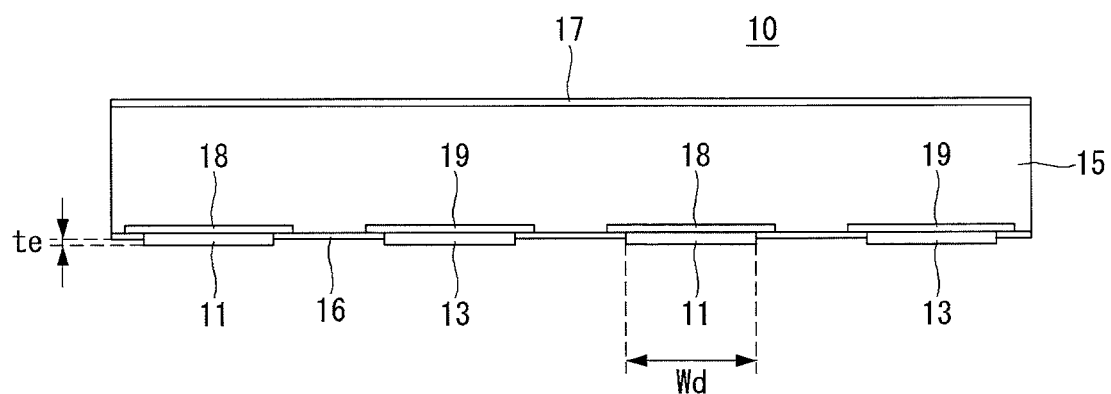
FIG. 4 is a cross-sectional view of a solar cell.

FIG. 3 shows that a plurality of solar cells are connected to wiring members, and FIG. 4 is a cross-sectional view of a solar cell. In the following description, an ordinal number, such as first and second, is used to describe the components for the sake of brevity and ease of reading.

As shown in FIG. 3, each of solar cells 10a to 10c has a regular hexahedron shape having a thin thickness. Each solar cell includes first conductive type electrodes (hereinafter, referred to as "first electrodes") 11 and second conductive type electrodes (hereinafter, referred to as "second electrodes") 13, which are formed on one surface (for example, a back surface) of the solar cell and dividedly collect electrons and holes.

The first electrodes 11 extend in a vertical direction and are arranged in parallel with one another, and the second electrodes 13 extend in the vertical direction and are arranged in parallel with one another. The first and second electrodes 11 and 13 are alternately arranged in a horizontal direction and are separated from each other by a uniform distance.

The first electrode 11 and the second electrode 13 are electrically connected to a wiring member 25 and thus are connected to the second electrode 13 and the first electrode 11 of another solar cell adjacent to the solar cell.

The wiring members 25 are disposed in the horizontal direction crossing the vertical direction of the first and second electrodes 11 and 13 and electrically connect the two adjacent solar cells. The solar cells 10a to 10c may be connected in series or in parallel to one another. In the following description, the instance, in which the solar cells are connected in series to one another, is described as an example.

The wiring member 25 includes a first wiring member 21 and a second wiring member 23. one side of the first wiring member 21 is electrically connected to the first electrode 11 of the second solar cell 10b positioned in the middle, and the other side is electrically connected to the second electrode 13 of the third solar cell 10c adjacent to the second solar cell 10b, thereby connecting the second solar cell 10b to the third solar cell 10c in series. Further, one side of the second wiring member 23 is electrically connected to the second electrode 13 of the second solar cell 10b positioned in the middle, and the other side is electrically connected to the first electrode 11 of the first solar cell 10a adjacent to the second solar cell 10b, thereby connecting the second solar cell 10b to the first solar cell 10a in series.

The first wiring members 21 and the second wiring members 23 are alternately arranged in the vertical direction and are positioned in parallel with each other.

As described above, because the wiring members 25 are disposed in a direction crossing the electrodes 11 and 13, it is easy to connect the wiring members 25 to the electrodes 11 and 13, and also the alignment between the wiring members 25 and the electrodes 11 and 13 becomes easy. In the embodiment of the invention, the first and second electrodes 11 and 13 are formed on the back surface of the solar cell in parallel with each other, and the wiring members 25 are connected to the first and second electrodes 11 and 13 in the direction crossing the first and second electrodes 11 and 13. Therefore, a thermal deformation direction of the wiring members 25 and a thermal deformation direction of the first and second electrodes 11 and 13 cross each other. Hence, the solar cell can be protected from a latent stress resulting from the thermal deformation.

In the embodiment of the invention, the wiring members 25 are electrically connected to the first and second electrodes 11 and 13 through a conductive layer formed of a resin including metal particles, or are insulated from the first and second electrodes 11 and 13 through an insulating layer formed of an insulating material or a bonding layer.

As shown in FIG. 4, the solar cell 10 according to the embodiment of the invention is a back contact solar cell, in which all of the first and second electrodes 11 and 13 are positioned on a back surface of a semiconductor substrate 15, but is not limited thereto.

The semiconductor substrate 15 forms a p-n junction. Thin layers 16 and 17, which prevent the reflection of light and perform a passivation function, are respectively formed on a front surface (on which light is incident) and the back surface (positioned opposite the front surface) of the semiconductor substrate 15.

A thin emitter region 18 and a thin back surface field region 19 are respectively formed between the first electrode 11 and the semiconductor substrate 15 and between the second electrode 13 and the semiconductor substrate 15 to ease the carriers to be collected by the electrodes 11 and 13. A width Wd of each of the first and second electrodes 11 and 13 may be narrower than a width of each of the thin emitter region 18 and the thin back surface field region 19. Also, each of the first and second electrodes 11 and 13 may protrude beyond a surface of the thin layer 16 by te.

The size of the solar cell 10 is approximately 160 mm long and 160 mm wide, and a thickness of the solar cell 10 is approximately 250 μm.

Figure 5:
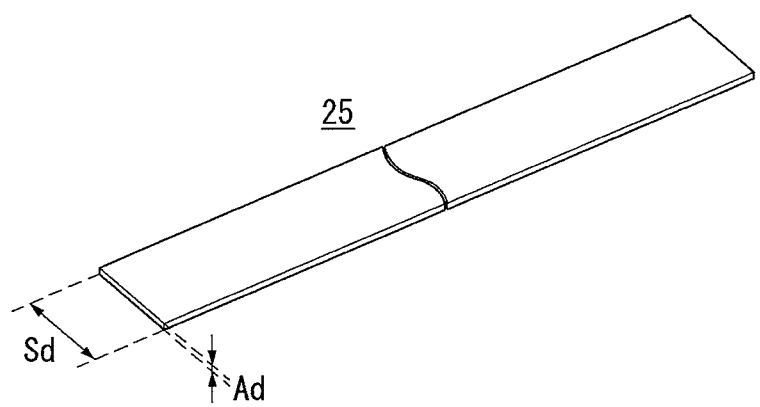
FIGS. 5 and 6 show a wiring member.

As shown in FIG. 5, the wiring member 25 according to the embodiment of the invention has a thin band shape. Other shapes may be used.

Figure 6:
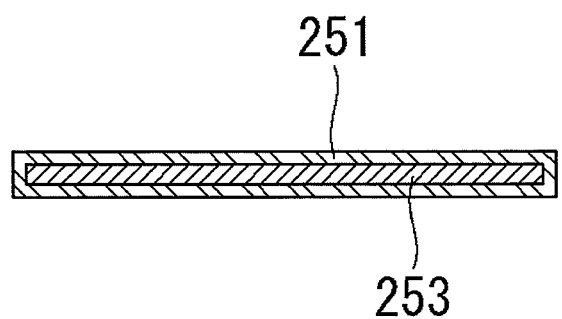

As shown in FIGS. 5 and 6, the wiring member 25 has a rectangular band shape having a thin thickness and has a rectangular cross section. Further, the wiring member 25 has a width Sd of 1 mm to 2 mm and a thickness Ad of 60 μm to 120 μm.

The embodiment of the invention may minimize the thermal deformation through a reduction in the thickness Ad of the wiring member 25 and also may smoothly perform the transfer of carriers through an increase in the width Sd of the wiring member 25.

The wiring member 25 has the cross sectional shape, in which a coating layer 251 forming the surface is coated on a core layer 253 with a thin thickness, for example, 15 μm to 35 μm. The core layer 253 may be formed of a metal material with good conductivity, for example, Ni, Cu, Ag, and Al. The coating layer 251 may be formed of Pb, Sn, or a solder having a chemical formula indicated by SnIn, SnBi, SnPb, SnCuAg, and SnCu, or a combination thereof.

The embodiment of the invention describes that the 10 to 36 wiring members thus formed are used to electrically connect the two adjacent solar cells. A number of wiring members may be selected among 10 to 36 depending on various factors including the size of the solar cell, the width of the wiring member, the size of the electrode, the pitch of the electrode, the material of the electrode, etc. The embodiments of the invention are not limited to 10 to 36 wiring members.

Figure 7:
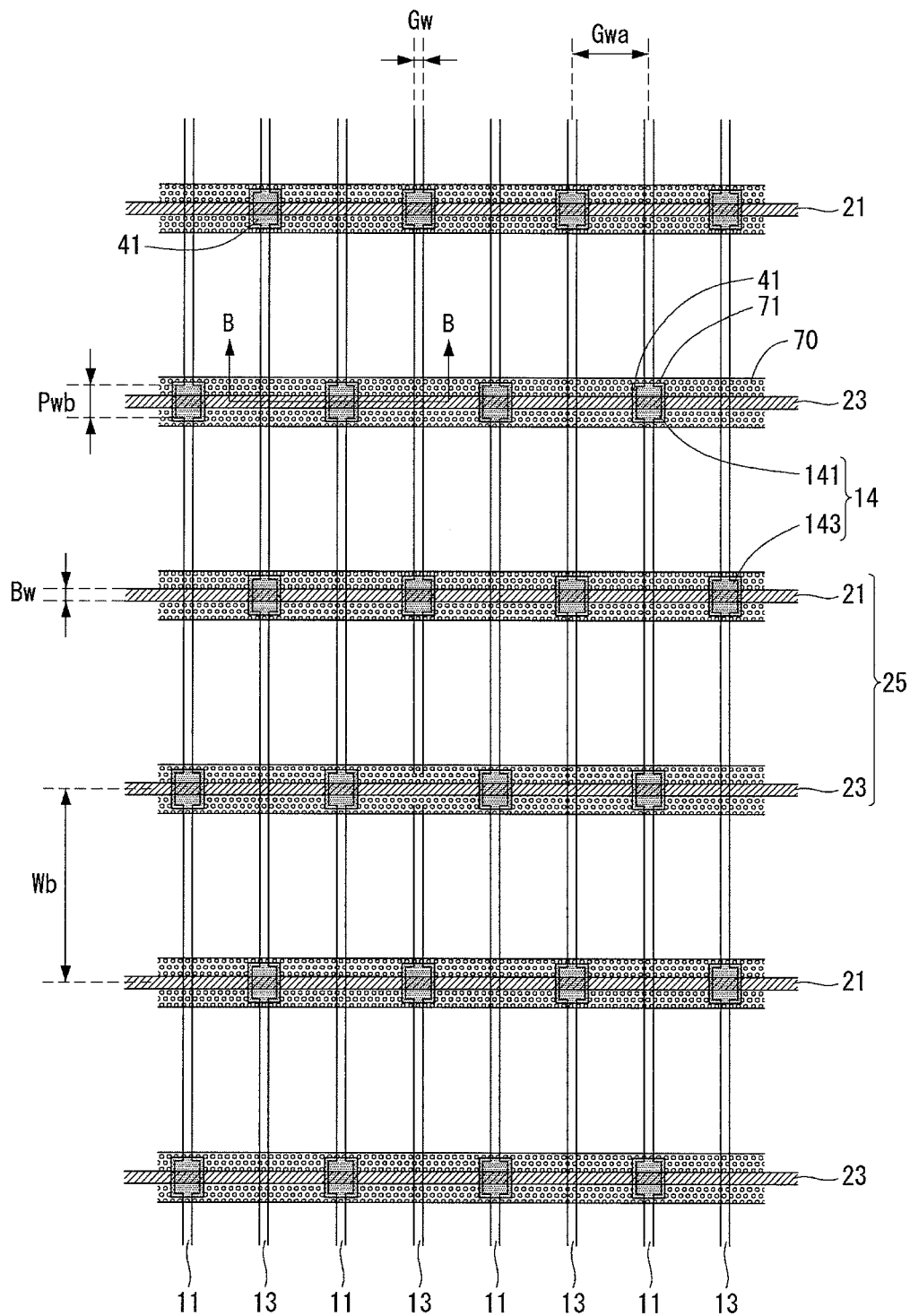
FIG. 7 shows a disposition of a wiring member, an electrode, and a bonding layer.
Figure 8:
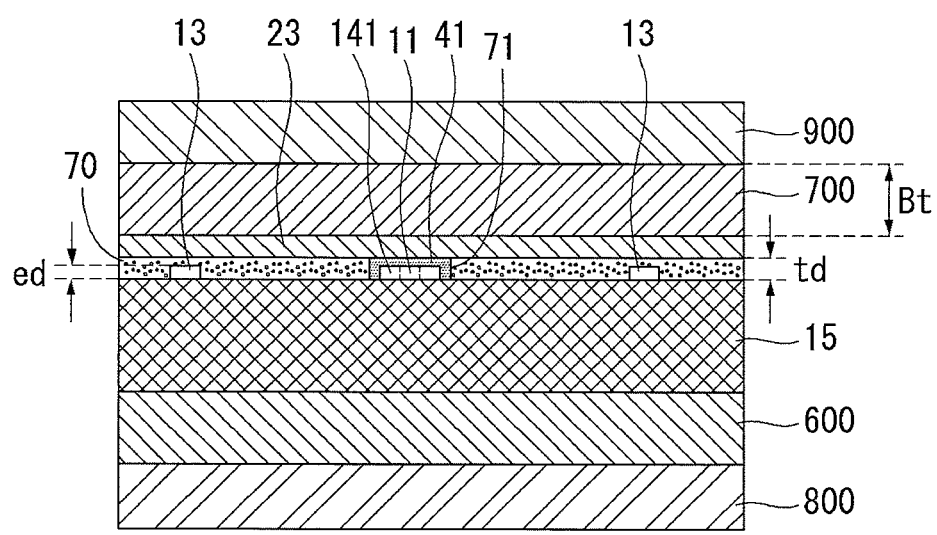
FIG. 8 is a cross-sectional view taken along line B-B of FIG. 7.

FIG. 7 shows a disposition of the wiring member, the electrode, and the bonding layer, and FIG. 8 is a cross-sectional view taken along line B-B of FIG. 7.

Figure 9:
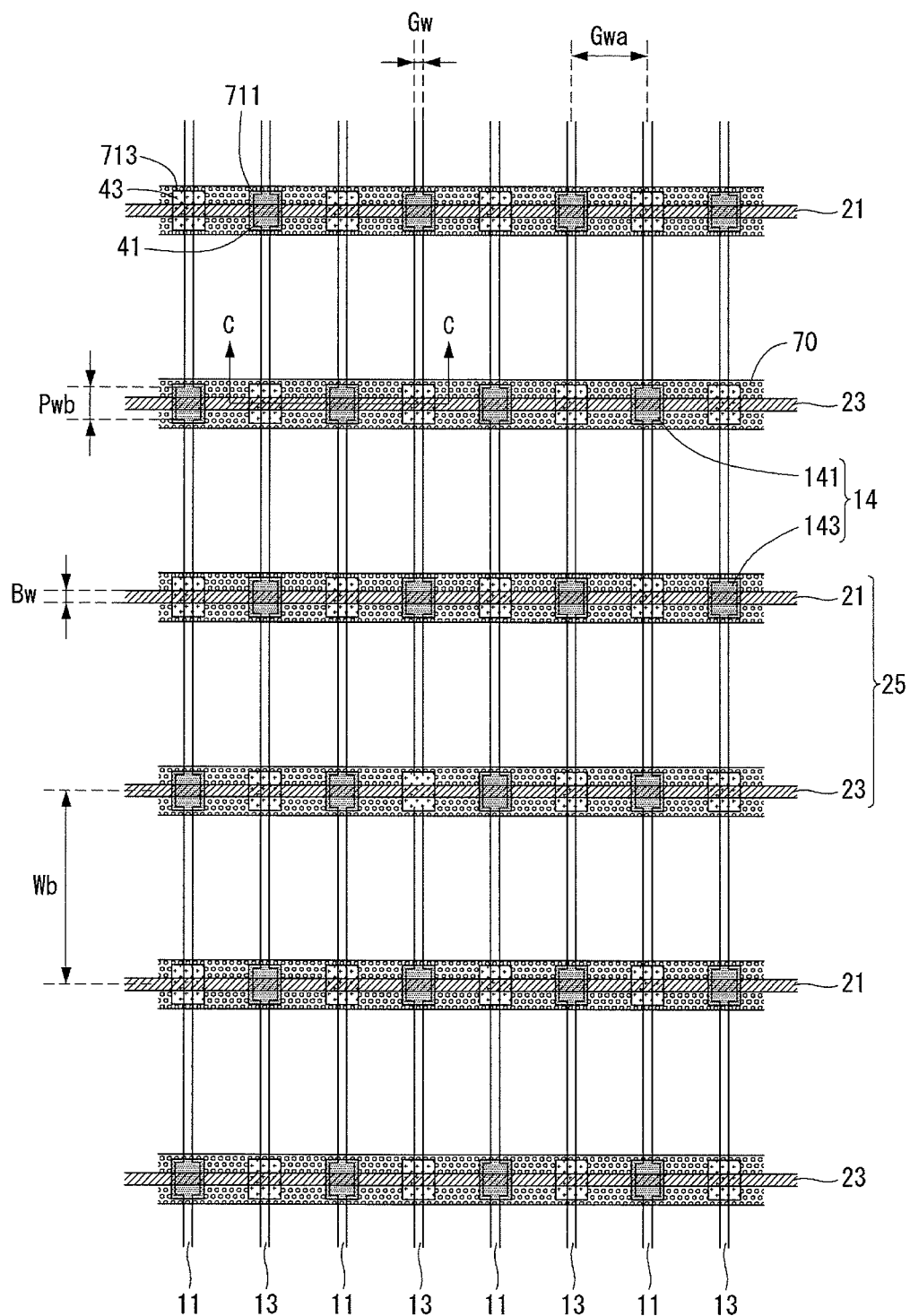
FIG. 9 shows that an insulating layer is formed at a non-connection portion.

As shown in FIGS. 7 and 8, in the embodiment of the invention, the first electrode 11 has a uniform width and extends in one direction, and the second electrode 13 has a uniform width and is separated from the first electrode 11 by a predetermined distance Gwa (see FIG. 9). The first and second electrodes 11 and 13 are arranged in parallel with each other. In the embodiment of the invention, the widths Gw of the first and second electrodes 11 and 13 are equal to each other and are 280 μm. The distance Gwa between the first and second electrodes 11 and 13 is 500 μm.

The wiring members 25 extend in the direction crossing the first and second electrodes 11 and 13 in parallel with one another and are separated from one another by a predetermined distance Wb. As described above, a width Bw of the wiring member 25 is 2 mm, and a pitch Wb of the wiring member 25 is 6 mm.

A pad 14 is formed at crossings of the wiring members 25 and the first and second electrodes 11 and 13. The pad 14 increases a contact area between the wiring member 25 and the electrode at the crossing and facilitates the connection between the wiring member 25 and the electrode, thereby reducing a contact resistance. The size of the pad 14 is 400 μm long and 1.7 mm wide (Pwb). The pad 14 thus formed is not always necessary.

FIG. 7 shows that the second electrode 13 is connected to the first wiring member 21 and the first electrode 11 is connected to the second wiring member 23. Hence, a first pad 141 is formed at a crossing of the first electrode 11 and the second wiring member 23 in an extension direction of the first electrode 11, and the pad does not exist at a crossing of the first electrode 11 and the first wiring member 21. On the contrary, a second pad 143 is formed at a crossing of the second electrode 13 and the first wiring member 21, and the pad does not exist at a crossing of the second electrode 13 and the second wiring member 23.

In the following description, a crossing, at which the electrodes 11 and 13 and the wiring member 25 are connected, is referred to as a connection portion, and a crossing, at which the electrodes 11 and 13 and the wiring member 25 are not connected, is referred to as a non-connection portion. When the pad 14 is included as in the embodiment of the invention, a crossing, at which the pad 14 is positioned, is the connection portion, and a crossing, at which the pad 14 is not positioned, is the non-connection portion.

A bonding layer 70 is formed along the wiring member 25. The bonding layer 70 is formed correspondingly to the first wiring member 21 and the second wiring member 23 and includes an opening 71 formed correspondingly to the connection portion. The first and second pads 141 and 143 are exposed through the opening 71. The first and second pads 141 and 143 may have a width of Pwb.

The bonding layer 70 is positioned between the wiring member 25 and the solar cell and attaches the wiring member 25 to the solar cell. The bonding layer 70 is formed of the same material as the passivation layers 600 and 700. For example, the bonding layer 70 may be formed of permeable resin, such as ethylene vinyl acetate (EVA) copolymer, ethylene-ethyl acrylate (EEA) copolymer, polyvinyl butyral (PVB), polyolefine, silicon, urethane, acrylic, and epoxy. Further, the bonding layer 70 may be formed of adhesive resin, such as acrylic, epoxy, and UV resin cured by ultraviolet rays, so as to obtain a high adhesive strength.

As shown in FIG. 8, the lower passivation layer 700 is formed on the bonding layer 70 formed of the above-described material. A water vapor transmission rate (WVTR) of the bonding layer 70 is equal to or less than a WVTR of the lower passivation layer 700, and thus the bonding layer 70 can efficiently protect the solar cells from water vapor.

The WVTR is an index indicating an amount of the passage of water vapor through a substance. The high WVTR indicates a large amount of passage of water vapor. Thus, in the embodiment of the invention, it is preferable, but not required, that the WVTR of the bonding layer 70 is equal to or less than the WVTR of the lower passivation layer 700.

When the WVTR of the bonding layer 70 is less than the WVTR of the lower passivation layer 700, the bonding layer 70 can efficiently prevent water vapor from passing through the solar cells.

In particular, because the wiring member 25 is formed of a metal material, which is easily oxidized by water vapor, a performance of the solar cell module is reduced when oxidation occurs. However, because the bonding layer 70 is formed along the wiring member 25 and surrounds the wiring member 25, the bonding layer 70 prevents water vapor from passing through the wiring member 25 and prevents the wiring member 25 from being oxidized.

When the WVTR of the bonding layer 70 is equal to the WVTR of the lower passivation layer 700, the bonding layer 70 and the lower passivation layer 700 may be formed of the same material. Therefore, it is easy to form the bonding layer 70 and the lower passivation layer 700.

On the other hand, when the WVTR of the bonding layer 70 is less than the WVTR of the lower passivation layer 700, a formation material of the bonding layer 70 may be selected depending on a formation material of the lower passivation layer 700.

As described above, in the embodiment of the invention, the lower passivation layer 700 may be formed of permeable resin, such as ethylene vinyl acetate (EVA) copolymer, ethylene-ethyl acrylate (EEA) copolymer, polyvinyl butyral (PVB), polyolefin, silicon, urethane, acrylic, and epoxy.

The bonding layer 70 may be formed of adhesive resin, such as acrylic, epoxy, and UV resin cured by ultraviolet rays. Among the above adhesive resins, the bonding layer 70 is formed of the material, of which a WVTR is equal to or less than the WVTR of the lower passivation layer 700. As described above, in the embodiment of the invention, the formation material of the bonding layer 70 is determined depending on the formation material of the lower passivation layer 700. A thickness Bt of the lower passivation layer 700 is greater than a thickness td of the bonding layer 70, and thus the lower passivation layer 700 can efficiently prevent water vapor from passing through the solar cells. In one example, the thickness Bt of the lower passivation layer 700 may be 300 µm to 400 µm, and the thickness td of the bonding layer 70 may be 70 µm to 100 µm. In the embodiment of the invention, because the wiring members 25 are attached to the solar cell by the bonding layers 70, it is easy connect the adjacent solar cells using the wiring members 25. Further, the bonding layers 70 can prevent the wiring members 25 from being connected to the electrodes 11 and 13 at a wrong location.

The electrodes 11 and 13 connected to the wiring member 25 only through the opening 71 are exposed and are blocked from the wiring member 25 through the bonding layer 70 at the non-connection portion. Therefore, although the first electrode 11 and the second electrode 13 are adjacent to each other, the wiring member 25 is accurately connected to the electrode, which has to be connected to the wiring member 25, through the bonding layer 70.

In the embodiment of the invention, a width Btw of the bonding layer 70 is greater than a width of the wiring member 25. Preferably, but not necessarily, the width Btw of the bonding layer 70 is greater than a width of the pad 14.

The pad 14 is exposed through the opening 71, and a conductive layer 41 is formed between the pad 14 and the wiring member 25. Hence, the wiring member 25 may be connected to the electrodes 11 and 13, or may be soldered and connected to the pad 14.

When the wiring member 25 is connected to the pad 14 through the soldering, the coating layer 251 of the wiring member 25 including the solder is melted by applying heat to the wiring member 25 at a temperature equal to or higher than a melting temperature of the solder. Hence, the wiring member 25 can be connected to the pad 14.

The conductive layer 41 is formed by adding conductive particles to the adhesive resin including at least one of acrylic, epoxy, or UV resin or solidifying a paste including conductive particles. The conductive particles may be particles formed of a conductive metal, for example, Al, Ag, or Cu, or may be particles formed of the solder including at least one of Pb, Sn, SnIn, SnBi, SnPb, SnCuAg, or SnCu.

A length and a width of the opening 71 are greater than a length and a width of the pad 14, so that the pad 14 is fully exposed through the opening 71. The conductive layer 41 is configured to fill a space exposed by the opening 71. In this instance, when a liquid conductive adhesive with viscosity is applied to the opening 71, the bonding layer 70 masks a remaining portion except the opening 71. Hence, the bonding layer 70 can prevent the wiring members 25 from being connected to the electrodes 11 and 13 at a wrong location due to the liquid conductive adhesive.

When a thickness td of the bonding layer 70 including the opening 71 is greater than a thickness ed of the electrodes 11 and 13, the wrong connection between the electrodes 11 and 13 and the wiring members 25 in the remaining portion except the opening 71 can be prevented as described above.

An adhesive strength of the bonding layer 70 may increase or decrease by adjusting the size of the opening 71. For example, as the size of the opening 71 decreases, for example, as the longitudinal size of the opening 71 in the longitudinal direction of the wiring member 25 decreases, an application area of the bonding layer 70 increases. Hence, the adhesive strength of the bonding layer 70 increases. On the contrary, as the size of the opening 71 increases, the adhesive strength of the bonding layer 70 decreases.

A connection strength between the electrodes 11 and 13 and the wiring members 25 increases as the size of the opening 71 increases. On the contrary, as the size of the opening 71 decreases, the connection strength decreases.

In other words, the size of the opening 71 has to increase so as to increase the connection strength, and also the size of the opening 71 has to decrease so as to increase the adhesive strength. Thus, the bonding layer 70 may be configured depending on one or more variables.

As a result, the size of the opening 71 may be entirely uniform, or may be differently configured, if necessary or desired.

In the embodiment of the invention, because the electrodes are fixed to the solar cell through the bonding layer 70, a reduction in the connection strength between the electrodes and the wiring members generated by connecting the wiring members to the electrodes only at the connection portion can be prevented.

Further, because the WVTR of the bonding layer 70 is equal to or less than the WVTR of the lower passivation layer 700, the wiring member 25 can be prevented from being oxidized due to the moisture.

So far, the embodiment of the invention described that the bonding layer 70 does not connect the electrodes 11 and 13 to the wiring member 25 at the non-connection portion, as an example. However, an insulating layer may be positioned along the non-connection portion and may be configured to insulate the electrodes 11 and 13 from the wiring member 25.

Figure 10:
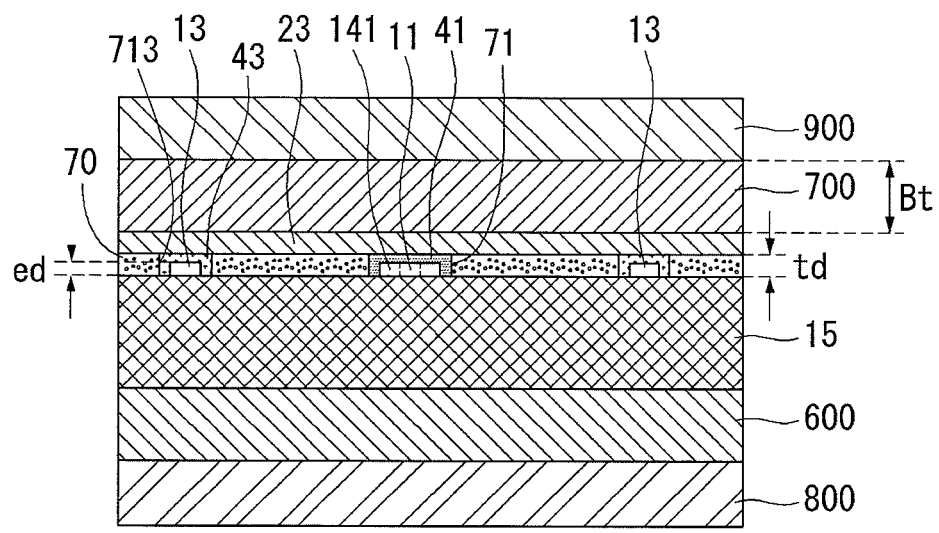
FIG. 10 is a cross-sectional view taken along line C-C of FIG. 9.

FIG. 9 shows that an insulating layer is formed at the non-connection portion. FIG. 10 is a cross-sectional view taken along line C-C of FIG. 9.

In the embodiment of the invention, the bonding layer 70 includes a first opening 711 exposing the pad 14 at the connection portion and a second opening 713 exposing the electrodes 11 and 13 at the non-connection portion.

As described above, the conductive layer 41 is positioned in the first opening 711 and connects the electrodes 11 and 13 to the wiring member 25.

An insulating layer 43 is positioned in the second opening 713 and insulates the electrodes 11 and 13 from the wiring member 25 at the non-connection portion.

The first opening 711 has to expose the pad 14 existing at the connection portion, but the second opening 713 does not need to expose a pad. Therefore, a length and a width of the second opening 713 may be less than a length and a width of the first opening 711.

The insulating layer 43 is formed by solidifying an insulation adhesive. The insulation adhesive may be formed of epoxy-based synthetic resin or silicon-based synthetic resin or an insulating material such as ceramic.

When a conductive adhesive is applied after forming the bonding layer 70, the insulation adhesive is applied along with the conductive adhesive. Further, when the conductive adhesive is thermally processed, the insulation adhesive is thermally processed along with the conductive adhesive. Hence, the conductive layer 41 and the insulating layer 43 may be formed.

As described above, in the embodiment of the invention, the wiring members 25 are attached to the solar cell through the bonding layer 70, and the electrodes 11 and 13 and the wiring members 25 are connected through the conductive layer 41 at the connection portion. Further, the insulating layer 43 prevents the electrodes 11 and 13 and the wiring members 25 from being connected at the non-connection portion.

So far, the embodiment of the invention described that the bonding layer 70 is formed only along the wiring member 25, as an example. However, the bonding layer 70 may be formed on the entire back surface of the solar cell. If the bonding layer 70 is formed on the entire back surface of the substrate of the solar cell, the bonding layer 70 may efficiently protect the solar cell from the moisture.

In the general solar cell module, the upper passivation layer and the lower passivation layer are positioned opposite each other with the solar cell interposed therebetween, and the upper substrate and the lower substrate are respectively positioned on the upper passivation layer and the lower passivation layer, thereby encapsulating the solar cell.

When the bonding layer 70 is formed on the entire back surface of the substrate of the solar cell, the bonding layer 70 is positioned between the solar cell and the lower passivation layer 700. Therefore, the bonding layer 70 can more efficiently prevent the water vapor from passing through the solar cell.

In this instance, the bonding layer 70 may be formed of the same material as the lower passivation layer 700. When the solar cell module is configured, the above-described components are laminated in a state where the above-described components are sequentially stacked. In such a process, if the bonding layer 70 and the lower passivation layer 700 are formed of the same material, a thermal fusion may occur. The problem of discoloration or peeling is not generated owing to the thermal fusion of the same material. Further, the solar cells 10 may be efficiently packaged owing to the same material of the bonding layer 70 and the lower passivation layer 700.

The WVTR of the bonding layer 70 is equal to or less than the WVTR of the lower passivation layer 700, so as to efficiently block the water vapor. In this instance, the WVTR decreases as the component of the solar cell module goes to the solar cell. Therefore, although the water vapor partially passes through the lower passivation layer 700, the bonding layer 70 can fully block the water vapor.

Figure 11:
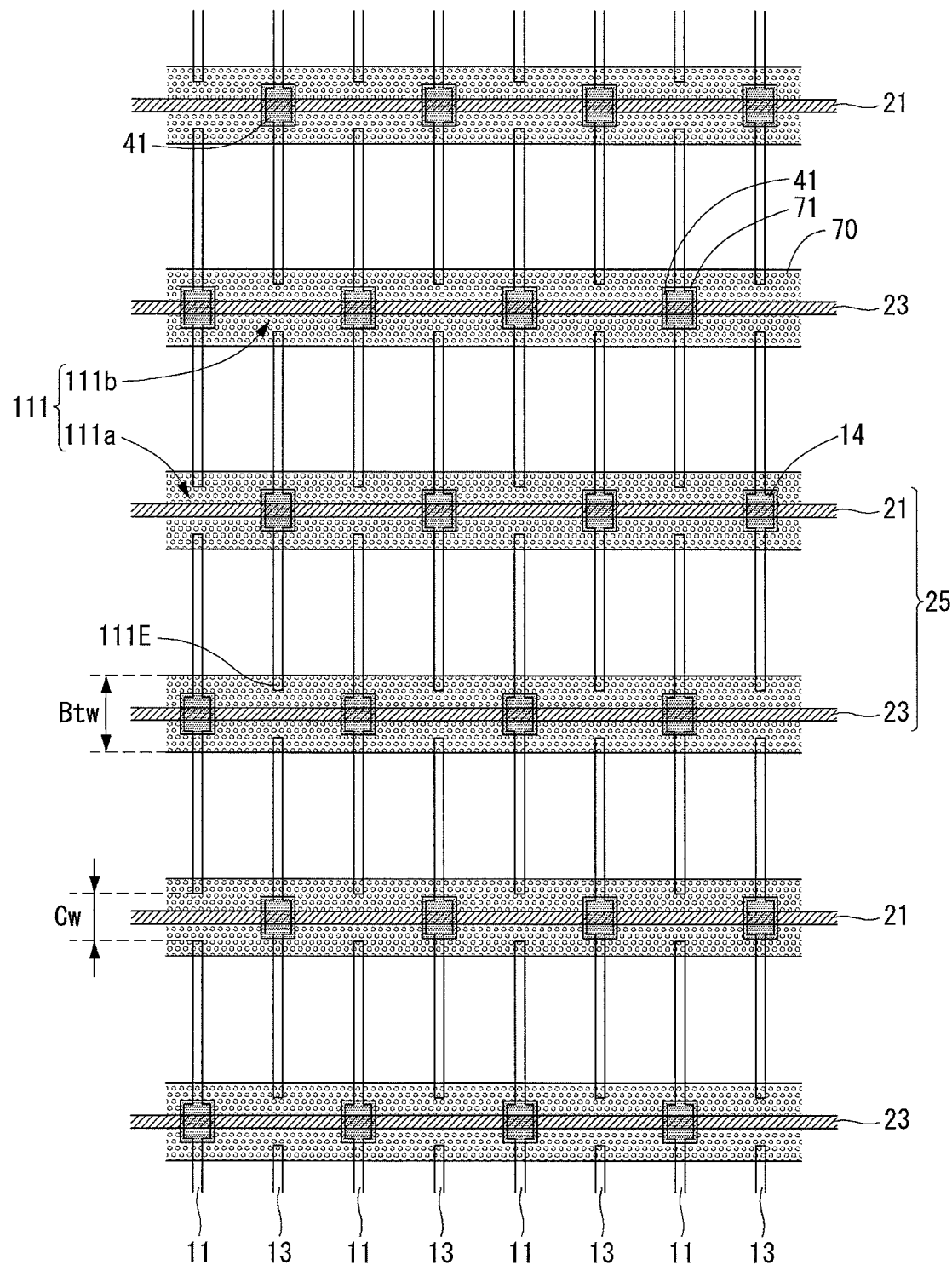
FIG. 11 shows that an electrode includes a disconnection portion along a non-connection portion.

FIG. 11 shows that each of the electrodes 11 and 13 includes a disconnection portion along the non-connection portion.

In the embodiment of the invention, each of the first and second electrodes 11 and 13 may include a disconnection portion 111 positioned at the non-connection portion.

The disconnection portion 111 is a portion, in which the electrode is partially cut off in a longitudinal direction and does not partially exist (or there is a lack of a part of the first and second electrodes 11 and 13). The disconnection portion 111 prevents the electrodes 11 and 13 and the wiring member 25 from physically contacting each other at the non-connection portion. A width of Cw of the disconnection portion 111 may be equal to or less than the width of the pad 14.

The disconnection portion 111 includes a first disconnection portion 111a positioned at a non-connection portion corresponding to a crossing of the first electrode 11 and the first wiring member 21 and a second disconnection portion 111b positioned at a non-connection portion corresponding to a crossing of the second electrode 13 and the second wiring member 23.

Although each of the electrodes 11 and 13 includes the disconnection portion 111 as described above, the electrodes 11 and 13 are connected to the wiring member 25 at the connection portion. Therefore, a reduction in the efficiency of the solar cell module is prevented. Because each of the electrodes 11 and 13 includes the disconnection portion 111, the manufacturing cost of the solar cell module may be reduced.

When each of the electrodes 11 and 13 includes the disconnection portion 111, the electrodes 11 and 13 and the wiring member 25 may be previously prevented from being connected to each other at the non-connection portion. Thus, the bonding layer 70 does not need to be used to connect the electrodes 11 and 13 to the wiring member 25 at the non-connection portion. As a result, the thickness of the bonding layer 70 may be reduced.

When each of the electrodes 11 and 13 includes the disconnection portion 111, a width W70 of the bonding layer 70 is greater than the width of Cw of the disconnection portion 111. Thus, it is preferable, but not required, that the bonding layer 70 wraps an end 111E of the electrode forming the disconnection portion 111.

In general, the end 111E of the electrode is easily deformed by heat. Therefore, when the solar cell is exposed to heat of a high temperature, the solar cell is easily peeled by the thermal deformation. However, in the embodiment of the invention, because the bonding layer 70 wraps the end 111E of the electrode, the peeling of the solar cell resulting from the thermal deformation can be prevented.

So far, the embodiment of the invention described that the bonding layer 70 overlaps the wiring member 25 and is formed in the same direction as the longitudinal direction of the wiring member 25, as an example. However, the bonding layer 70 may be formed in a direction crossing the longitudinal direction of the wiring member 25.

This is described in detail below with reference to FIGS. 12 to 15.

The description of structures and components identical or equivalent to those described above is omitted in FIGS. 12 to 15, and a difference therebetween is mainly described. FIGS. 12 to 15 show an example where the pad and the disconnection portion are not formed. However, the pad and the disconnection portion may be formed in FIGS. 12 to 15 as in the above-described embodiment.

Figure 12:
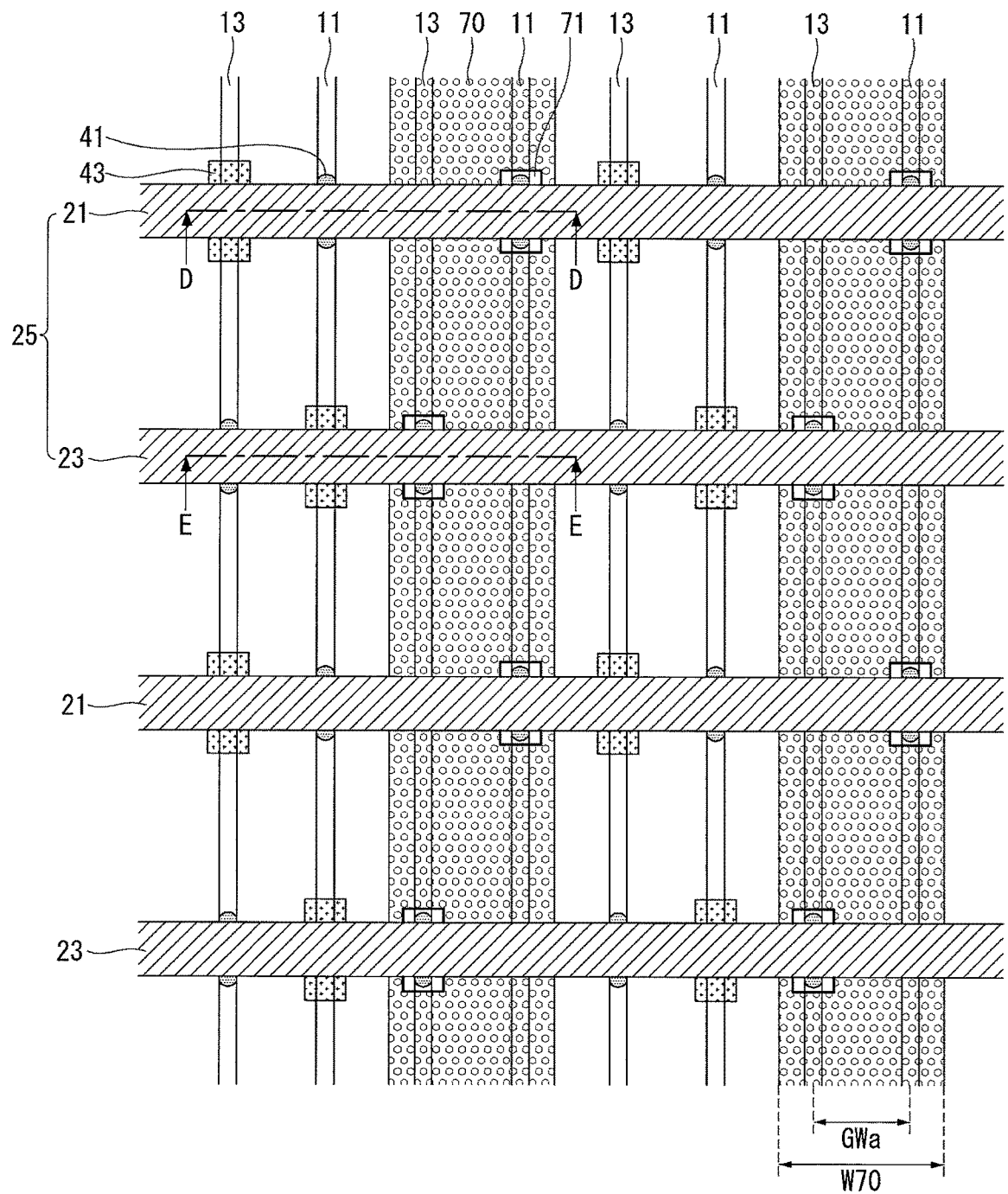
FIGS. 12 and 13 show a first example where a longitudinal direction of a bonding layer crosses a longitudinal direction of a wiring member.
Figure 13:
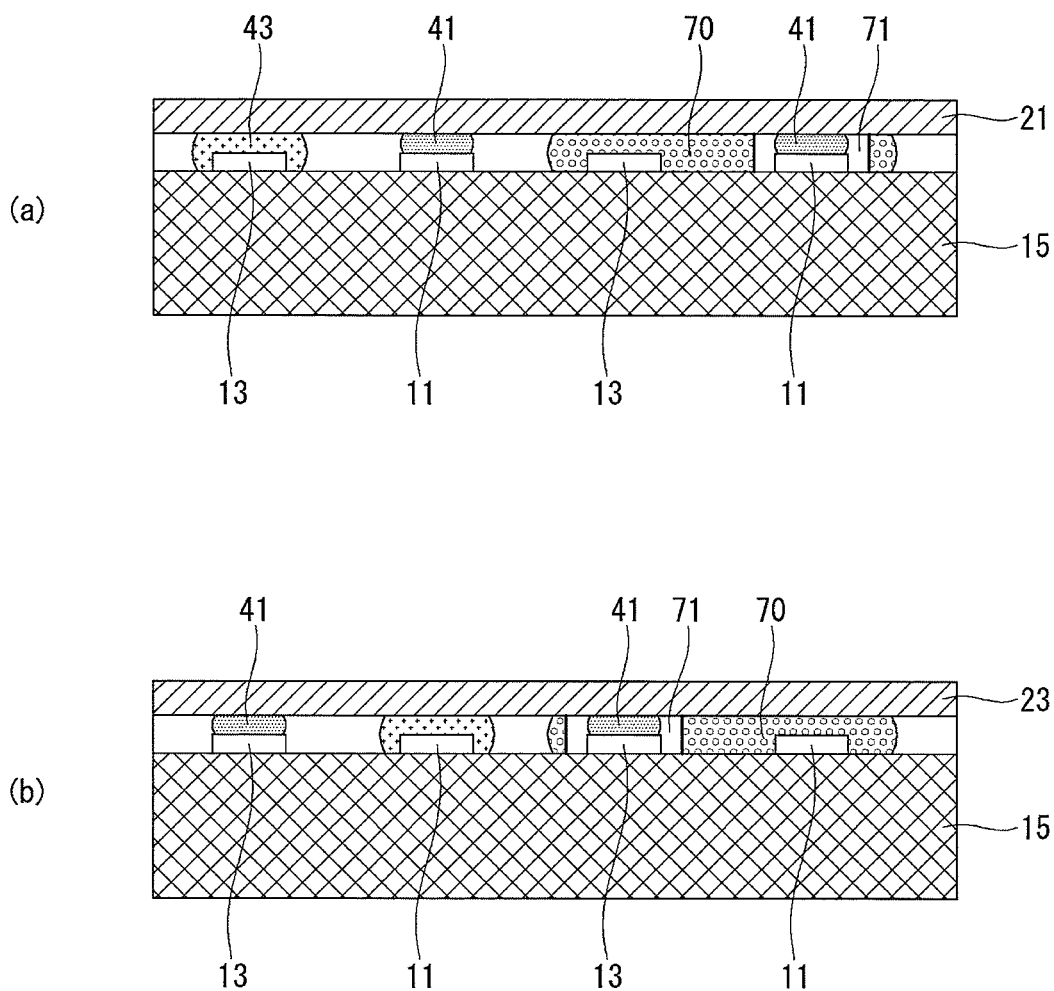

FIGS. 12 and 13 show a first example where a longitudinal direction of the bonding layer 70 crosses a longitudinal direction of the wiring member 25. More specifically, FIG. 12 is a plane view showing the crossing between the longitudinal direction of the bonding layer 70 and the longitudinal direction of the wiring member 25. In FIG. 13, (a) is a cross-sectional view taken along line D-D of FIG. 12, and (b) is a cross-sectional view taken along line E-E of FIG. 12.

As shown in FIG. 12, each of the plurality of bonding layers 70 may extend in a direction crossing each of the plurality of wiring members 25.

Thus, a longitudinal direction of the bonding layer 70 may be the same as a longitudinal direction of the electrodes 11 and 13. The material of the bonding layer 70 was described above.

Although a number of bonding layers 70 is less than a number of wiring members 25, the wiring members 25 can be stably attached to the back surface of the semiconductor substrate 15 in the manufacturing process of the solar cell module. Hence, the manufacturing cost may be reduced, and the process efficiency may be further improved.

In this instance, the width W70 of the bonding layer 70 may be greater than a distance between the two adjacent electrodes 11 and 13.

Accordingly, as shown in FIG. 12, the width W70 of the bonding layer 70 may have a width capable of covering at least two electrodes. FIG. 12 shows that the bonding layer 70 has the width covering the two adjacent electrodes 11 and 13, as an example. However, the bonding layer 70 may have a width covering the two or more electrodes, for example, three or four electrodes.

Because the bonding layer 70 has the width described above, the bonding layer 70 may have a physical force capable of sufficiently attaching the wiring members 25 to the back surface of the semiconductor substrate 15 in the manufacturing process of the solar cell module.

The bonding layer 70 shown in FIG. 12 is positioned between the wiring member 25 and the electrodes 11 and 13 as shown in (a) and (b) of FIG. 13. Therefore, the opening 71 may be formed between the wiring member 25 and the electrodes 11 and 13, which have to be electrically connected to each other.

For example, as shown in (a) and (b) of FIG. 13, when the first wiring member 21 is connected to the first electrode 11 and the second wiring member 23 is connected to the second electrode 13, each of the plurality of bonding layers 70 may have the opening 71 at a crossing of the first wiring member 21 and the first electrode 11 and at a crossing of the second wiring member 23 and the second electrode 13.

Further, the conductive layer 41 may electrically connect the first wiring member 21 to the first electrode 11 and also may electrically connect the second wiring member 23 to the second electrode 13.

As shown in (a) and (b) of FIG. 13, the bonding layer 70 may insulate the first wiring member 21 from the second electrode 13 and also may insulate the second wiring member 23 from the first electrode 11.

Further, the separate insulating layer 43 may insulate the first wiring member 21 from the second electrode 13 and also may insulate the second wiring member 23 from the first electrode 11 in a portion not having the bonding layer 70.

The materials of the conductive layer 41 and the separate insulating layer 43 were described above.

As described above, FIGS. 12 and 13 show that the longitudinal direction of the bonding layer 70 crosses the longitudinal direction of the wiring member 25, and the bonding layer 70 is positioned between the wiring member 25 and the electrodes 11 and 13, as an example. However, the bonding layer 70 may be configured to cover the wiring member 25. This is described in detail below with reference to FIGS. 14 and 15.

Figure 14:
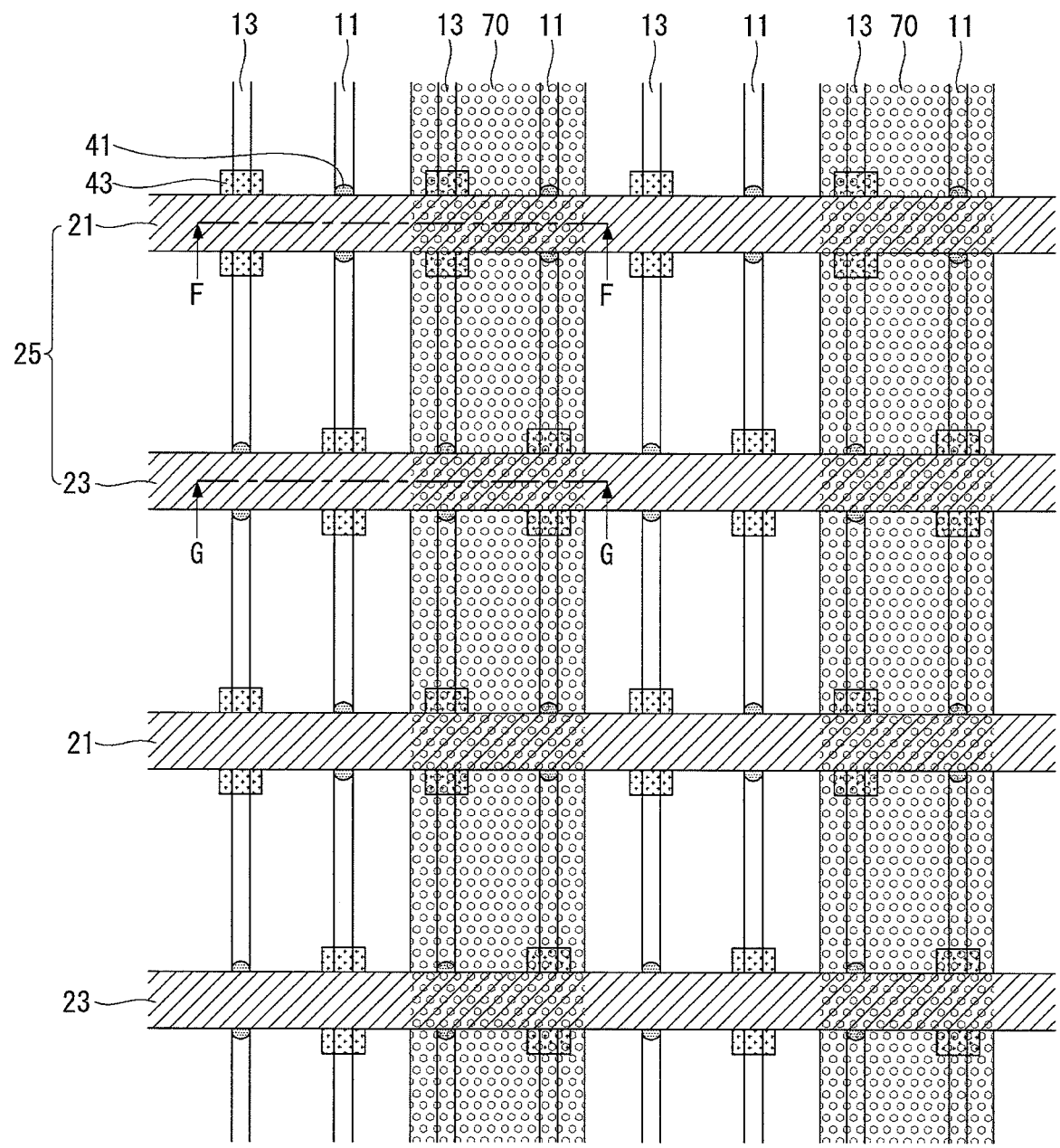

FIGS. 14 and 15 show a second example where a longitudinal direction of the bonding layer 70 crosses a longitudinal direction of the wiring member 25. More specifically, FIG. 14 is a plane view showing that the longitudinal direction of the bonding layer 70 crosses the longitudinal direction of the wiring member 25 and the bonding layer 70 covers the wiring member 25. In FIG. 15, (a) is a cross-sectional view taken along line F-F of FIG. 14, and (b) is a cross-sectional view taken along line G-G of FIG. 14.

As shown in FIGS. 14 and 15, the bonding layer 70 may extend in a direction crossing the longitudinal direction of the wiring member 25 and cover the wiring member 25.

As shown in FIG. 14, the bonding layer 70 is applied or attached in a state where the insulating layer 43 is formed on the electrodes 11 and 13 which have to be insulated from the wiring member 25, the conductive layer 41 is formed on the electrodes 11 and 13 which have to be electrically connected to the wiring member 25, and the wiring member 25 is positioned on the electrodes 11 and 13. Hence, the wiring member 25 may be fixed to the back surface of the semiconductor substrate 15.

The bonding layer 70 may be melted in a lamination process using a thermal pressing method in a state where the wiring member 25 is fixed to the back surface of the semiconductor substrate 15 by the bonding layer 70. The bonding layer 70 may be cured in a state where a space between the wiring member 25 and the semiconductor substrate 15 or a space between the wiring member 25 and the electrodes 11 and 13 is filled with the bonding layer 70.

The conductive layer 41 may be melted in the lamination process and may electrically connect the wiring member 25 to the electrodes 11 and 13.

Hence, the bonding layer 70 may be formed as shown in (a) and (b) of FIG. 15.

Further, FIGS. 14 and 15 show that the insulating layer 43 is separately formed even in a formation area of the bonding layer 70 in the back surface of the semiconductor substrate 15, as an example. However, the bonding layer 70 may perform an insulation function in the formation area of the bonding layer 70, and thus the separate insulating layer 43 may be omitted.

In the second example showing the crossing of the longitudinal direction of the bonding layer 70 and the longitudinal direction of the wiring member 25, the opening 71 of the bonding layer 70 may be omitted, unlike the first example.

In the second example, the bonding layer 70 is configured to cover the wiring member 25, and the opening 71 of the bonding layer 70 is omitted. Therefore, when the bonding layer 70 is formed on the wiring member 25, the second example does not require an accurate alignment process, unlike the first example. Hence, the second example can make the manufacturing process easier.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
    a front substrate;
    a back substrate;
    a plurality of solar cells each including a semiconductor substrate, and first electrodes and second electrodes which are alternately arranged in parallel with each other and formed on a back surface of the semiconductor substrate, the first electrodes and the second electrodes extending in a first direction;
    a plurality of wiring members configured to electrically connect adjacent two solar cells of the plurality of solar cells, and extending in a second direction crossing the first direction;
    a plurality of bonding layers configured to fix the plurality of wiring members to the plurality of solar cells, and each having a first water vapor transmission rate and a first thickness;
    a front passivation layer configured to encapsulate the plurality of solar cells and the front substrate; and
    a back passivation layer configured to encapsulate the plurality of solar cells and the back substrate, and having a second water vapor transmission rate higher than the first water vapor transmission rate and a second thickness thicker than the first thickness,
    wherein the first thickness of the plurality of bonding layers is approximately 70 μm to 100 μm, and
    wherein each bonding layer extends in the first direction configured to parallel the first and second electrodes and has a second direction width covering at least a first electrode and an adjacent second electrode of the first electrodes and the second electrodes.

2. The solar cell module of claim 1, wherein the plurality of bonding layers are positioned in parallel with one another and form a stripe arrangement.

3. The solar cell module of claim 1, wherein the plurality of bonding layers are entirely formed on each solar cell.

4. The solar cell module of claim 1, wherein each bonding layer includes openings exposing the first electrodes at crossings of the plurality of wiring members and the first electrodes.

5. The solar cell module of claim 1, wherein a thickness of the plurality of bonding layers is greater than a thickness of the second electrodes.

6. The solar cell module of claim 1, wherein the plurality of bonding layers insulate the second electrodes from the plurality of wiring members at crossings of the plurality of wiring members and the second electrodes.

7. The solar cell module of claim 4, wherein the first electrodes are soldered to the plurality of wiring members at the openings.

8. The solar cell module of claim 7, further comprising a conductive layer positioned in the openings and configured to connect the plurality of wiring members to the first electrodes, the conductive layer being an adhesive resin including conductive particles.

9. The solar cell module of claim 8, wherein the conductive particles are particles formed of a conductive metal or are particles formed of a solder including at least one of Pb, Sn, SnIn, SnBi, SnPb, SnCuAg, or SnCu.

10. The solar cell module of claim 1, wherein the plurality of bonding layers further include second openings exposing the second electrodes at crossings of the plurality of wiring members and the second electrodes.

11. The solar cell module of claim 10, further comprising an insulating layer positioned in the second openings and configured to insulate the plurality of wiring members from the plurality of second electrodes.

12. The solar cell module of claim 1, wherein the plurality of wiring members have a rectangular cross section, and
    wherein a width of the plurality of wiring members is 1 mm to 2 mm, and a thickness of the plurality of wiring members is 60 μm to 120 μm.

13. The solar cell module of claim 12, wherein 10 to 36 of the plurality of wiring members are used to connect adjacent solar cells of the plurality of solar cells.

14. The solar cell module of claim 1, wherein the plurality of wiring members are interposed between the plurality of bonding layers and the back passivation layer.

15. The solar cell module of claim 1, wherein a thickness of the plurality of bonding layers is greater than each of a thickness of the first electrodes and a thickness of the second electrodes.

16. The solar cell module of claim 1, wherein the plurality of bonding layers are positioned between the plurality of wiring members and the back surface of the semiconductor substrate.

17. The solar cell module of claim 1, wherein each of the front and back passivation layers includes at least one of ethylene vinyl acetate (EVA) copolymer, ethylene-ethyl acrylate (EEA) copolymer, polyvinyl butyral (PVB), polyolefine, silicon, urethane, acrylic, or epoxy, and wherein bonding layer of the plurality of bonding layer is formed of an adhesive resin including at least one of acrylic, epoxy, or UV resin.

18. The solar cell mode claim 1, wherein each bonding layer intersects the plurality of wiring members.

* * * * *